United States Patent
Ding et al.

(10) Patent No.: US 8,248,276 B2
(45) Date of Patent: Aug. 21, 2012

(54) SCANNING CIRCUIT AND SCANNING METHOD FOR KEYBOARD

(75) Inventors: Lin-Kun Ding, Shenzhen (CN);
Xiang-Ping Zhou, Shenzhen (CN);
Ren-Wen Huang, Shenzhen (CN);
Li-Sheng Shu, Shenzhen (CN);
Tsung-Jen Chuang, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 295 days.

(21) Appl. No.: 12/817,188

(22) Filed: Jun. 17, 2010

(65) Prior Publication Data

US 2011/0050465 A1    Mar. 3, 2011

(30) Foreign Application Priority Data

Aug. 26, 2009  (CN) .......................... 2009 1 0306111

(51) Int. Cl.
*H03K 17/94* (2006.01)

(52) U.S. Cl. ........................................... 341/26; 341/22
(58) Field of Classification Search .................... 341/22, 341/26
See application file for complete search history.

(56) References Cited

U.S. PATENT DOCUMENTS

| 4,633,228 A * | 12/1986 | Larson ........................ 341/26 |
| 5,872,561 A * | 2/1999 | Figie et al. .................. 345/168 |
| 7,123,170 B1 * | 10/2006 | Iacob ........................... 341/26 |

* cited by examiner

*Primary Examiner* — Khai M Nguyen
(74) *Attorney, Agent, or Firm* — Altis Law Group, Inc.

(57) ABSTRACT

A scanning circuit includes n rows L1~Ln, 2n columns P1-1~P1-*n* and P2-1~P2-*n*, and the n rows L1~Ln and the n columns P1-1~P1-*n* cooperatively form a switch matrix comprising n*n switches S1-1~Sn-n, with ends of the switches in the same row electrically connected to one of n I/O ports K1~Kn, respectively, the ends of the switches in the same column are electrically connected to ground via one resistor R1-1~R1-*n*, respectively, each of resistors R2-1~R2-*n* is electronically connected in one column of the columns P2-1~P2-*n*, and connected between one of the I/O ports K1~Kn and ground via one of the resistors R1-1~R1-*n*, respectively. A keyboard and a scanning method are also provided.

14 Claims, 5 Drawing Sheets

… (1)

SCANNING CIRCUIT AND SCANNING METHOD FOR KEYBOARD

BACKGROUND

1. Technical Field

The present disclosure relates to device scanning and, particularly, to a scanning circuit and a scanning method thereof for a keyboard.

2. Description of Related Art

Referring to FIG. 1, a frequently used scanning circuit 100 used in a keyboard (not shown) usually includes sixteen keys. The scanning circuit 100 includes four rows R1~R4 and four columns C1~C4, constituting a switch matrix (not labeled) including sixteen intersections. Sixteen switches C1R1~C4R4 are set at the intersections respectively, with two contacts of each switch electrically connected to a corresponding row and a corresponding column respectively, for example one contact of a switch C1R1 is electrically connected to a row R1 and the other contact of the switch C1R1 is electrically connected to a column C1. Each of the sixteen switches is normally open until a key is pressed, and then a corresponding switch, for example, C1R1, closes, and the row R1 and the column C1 are electrically connected. When the key is released, the corresponding switch opens. Furthermore, four input ports P1~P4 are electrically connected to ends of the columns C1~C4 respectively, and four output ports P5~P8 are electrically connected to the rows R1~R4 respectively. A power source is electrically connected to the other end of each column via a resistor.

During scanning, voltage of each input port P1~P4 is sequentially set to low. When the voltage of one of the input ports P1~P4 is set to low, the voltages of the remaining input ports P1~P4 are set to high. The output ports are checked to determine whether any switches are closed, and thereby pressed keys corresponding to the switches can be identified.

As an example, if the voltage of the input port P1 electrically connected to the column C1 is set to be low, the voltage of the output port P5 electrically connected to the row R1 is also low, then the switch C1R1 is determined to be closed. Consequently, a pressed key corresponding to the switch C1R1 can be determined.

In practice, the input ports and the output ports are generally provided by a single-chip microprocessor. However, providing a microprocessor with so many ports is a waste.

Therefore, it is desirable to provide a scanning circuit and a scanning method capable of using fewer ports, which can overcome the limitations described.

BRIEF DESCRIPTION OF THE DRAWINGS

The components in the drawing are not necessarily drawn to scale, the emphasis instead being placed upon clearly illustrating the principles of the disclosure.

DETAILED DESCRIPTION

Figure 1:
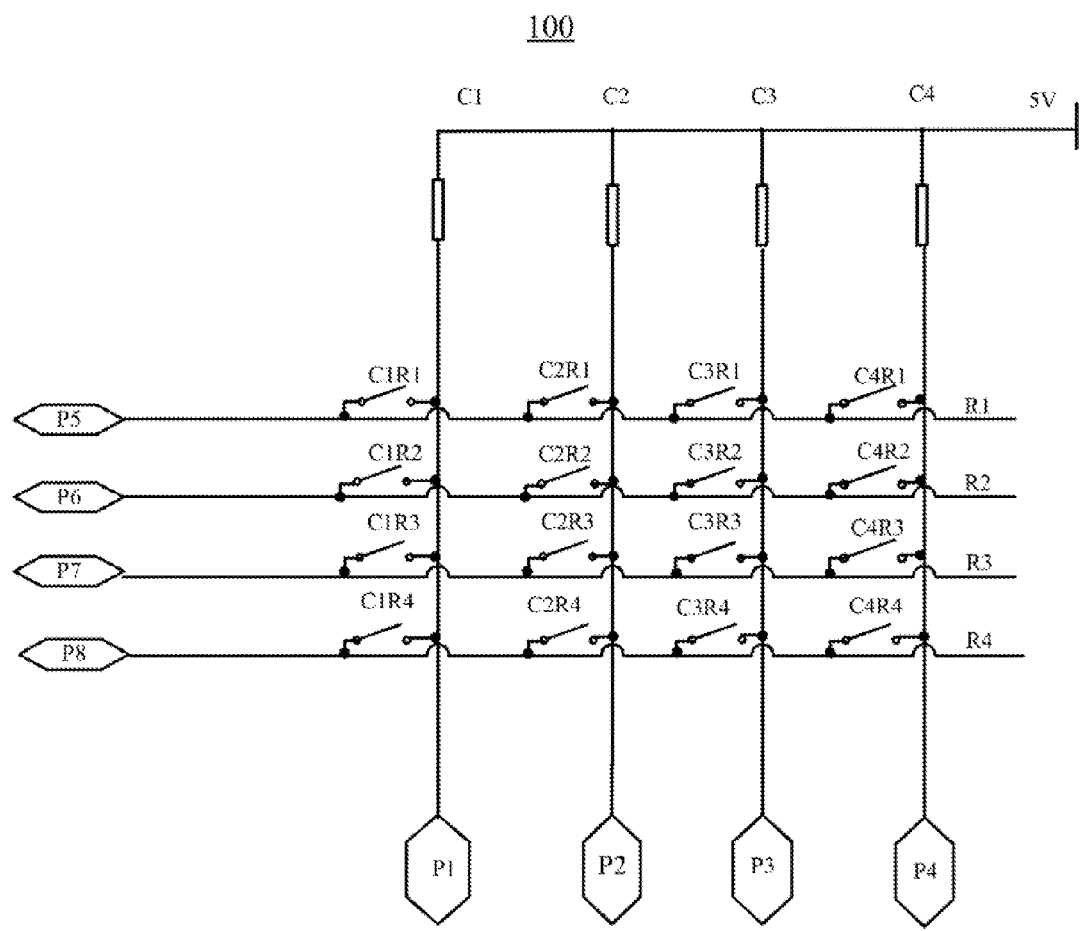
FIG. 1 is a schematic diagram showing a conventional scanning circuit.
Figure 2:
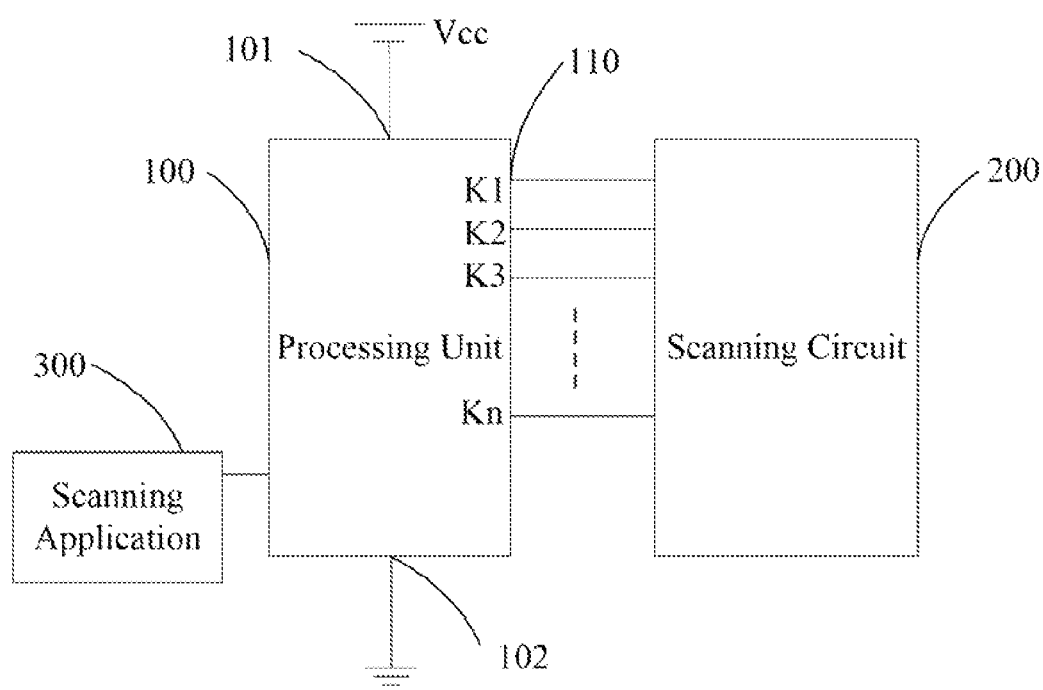
FIG. 2 is a schematic diagram of a keyboard in accordance with an exemplary embodiment.

Referring to FIG. 2, a keyboard 10 in accordance with an exemplary embodiment is illustrated. The keyboard 10 includes a processing unit 100, a scanning circuit 200, and a scanning application 300. The processing unit 100 includes n I/O ports 110. The n I/O ports 110 are configured to electrically connect the scanning circuit 200 to the processing unit 100. The scanning application 300, pre-stored in a memory (not shown) of the keyboard 10 is implemented by the processing unit 100 to determine which key (not shown) in the keyboard 10 is pressed.

The processing unit 100 may be a single-chip microprocessor, which further includes a power pin 101 electrically connected to a power supply VCC, and a ground pin 102 electrically connected to ground. The I/O ports 110 can be set to input ports and output ports. When one of the I/O ports 110 is set to input port, the voltage thereof is determined by a connected external input source. That is, if the voltage of the external input source is low, the voltage of the one I/O port 110 is low. If the voltage of the external input source is high, the voltage of the one I/O port 110 is high. When one of the I/O ports 110 is used as output port, the voltage of the one I/O port 110 is determined by the processing unit 100.

Figure 3:
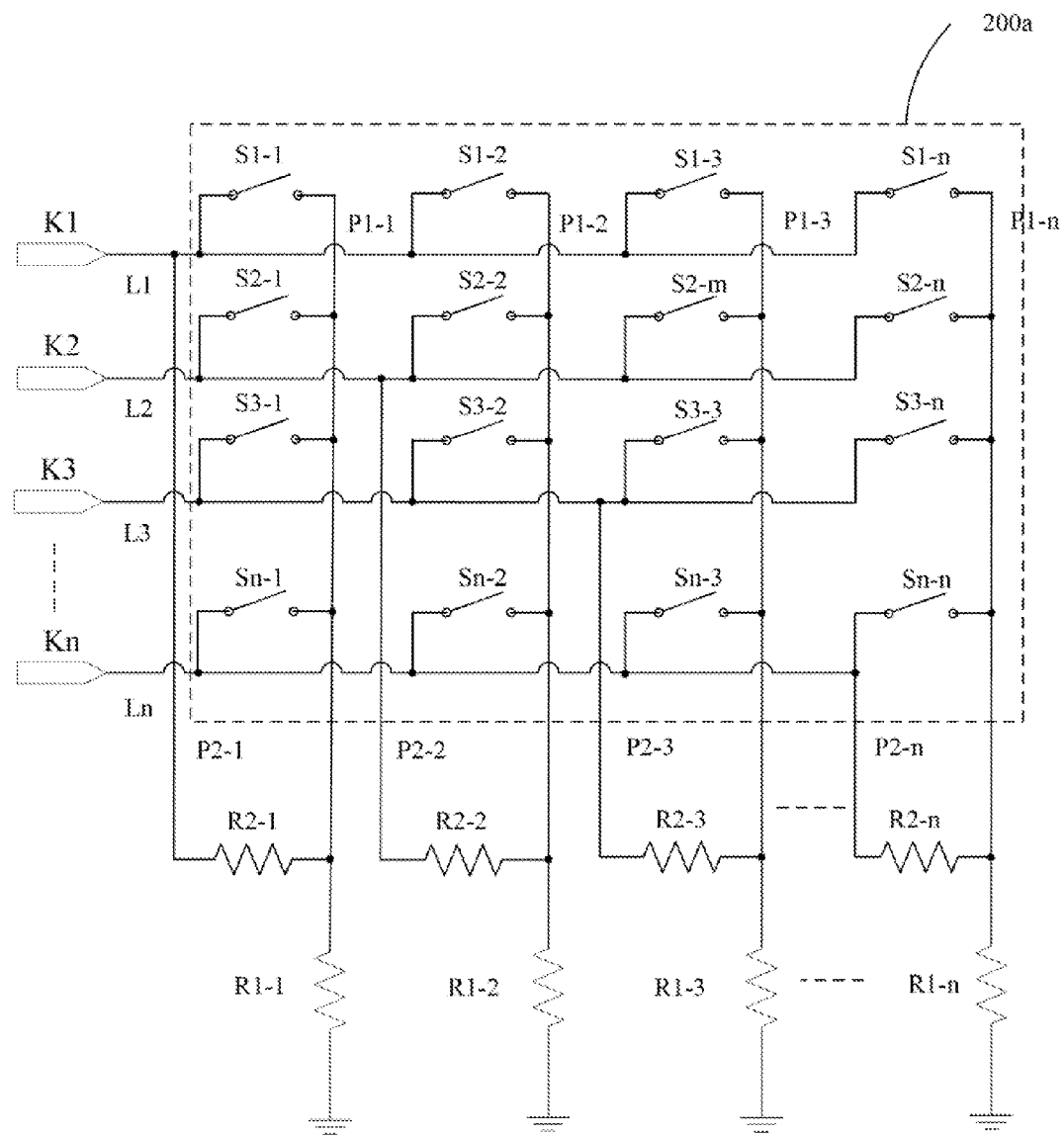
FIG. 3 is a schematic diagram of a scanning circuit in the keyboard of FIG. 2.

FIG. 3 is a schematic diagram of the scanning circuit 200 in the keyboard 10 of FIG. 2. The scanning circuit 200 includes n rows L1~Ln and n columns P1-1~P1-$n$. In the embodiment, n is a natural number not less than two. The n rows L1~Ln and n columns P1-1~P1-$n$ cooperatively form a switch matrix 200a including n*n switches S1-1~Sn-n. An end of each of the switches in the same row is electrically connected to one of the n I/O ports K1~Kn, respectively. Another end of each of the switches in the same column is electrically connected to ground via one resistor R1-1~R1-$n$, respectively. The resistances of the resistors R1-1~R1-$n$ are similar to each other or the same, and quite low.

The scanning circuit 200 further includes n columns P2-1~P2-$n$. Each of the columns P2-1~P2-$n$ intersects one of the rows L1~Ln and one of the columns P1-1~P1-$n$. Each of the columns P2-1~P2-$n$ includes one resistor R2-1~R2-$n$, respectively. One end of each one of the resistors R2-1~R2-$n$ is electrically connected to one of the I/O ports K1~Kn, and another end of the resistors R2-1~R2-$n$ is electrically connected to ground via one of the resistors R1-1~R1-$n$. For example, one end of the resistor R2-2 is electrically connected to the I/O port K2 and the other end is electrically connected to ground via the resistor R1-2. The resistance of the resistors R2-1~R2-$n$ are similar to each other or the same. The resistance of the resistors R2-1~R2-$n$ exceeds those of resistors R1-1~R1-$n$.

In use, the processing unit 100 sets all the I/O ports K1~Kn to input ports. The states of the I/O ports K1~Kn are detected. If one of the keys is pressed, the voltage of the I/O port connected to the switch corresponding to the pressed key is changed to low. In the embodiment, each of the I/O ports K1~Kn is connected to the ends of at least two switches in the same row. Therefore, the processing unit 100 can only determine that one of the switches in the row corresponding to the I/O port the voltage of which has been changed to low is pressed, but cannot determine which it is.

In order to determine which of the switches in the row is pressed, the processing unit 100 then sets all the I/O ports K1~Kn to output ports. The voltage of the I/O port the voltage of which has been changed to low is set to high, and the voltages of the other I/O ports are set to low. In the embodiment, when the voltage of the I/O port the voltage of which has been changed to low is set to high, the voltage of one of the resistors R2-1~R2-$n$ electrically connected to the pressed switch is accordingly changed to high. Therefore, the voltage of the I/O port electrically connected to the one of the resistors R2-1~R2-$n$ is changed to high. The processing unit 100 resets all the I/O ports K1~Kn to input ports. The processing unit 100 then re-checks the states of the I/O ports K1~Kn. The processing unit 100 determines that the switch, with one end in the row electrically connected to the one I/O port the voltage of which is set to high and another end in the column electrically connected to the one I/O port via one of the n resistors R2-1~R2-n the voltage of which is changed to high or remains high if voltages of the I/O ports are not changed, is pressed. In the embodiment, the scanning circuit 200 employs n I/O ports K1~Kn to determine which of the n*n switches is pressed. Compared to a scanning circuit employing n input ports and n output ports, n ports are conserved.

In a preferred embodiment, while determining which switch is pressed, the processing unit 100 first records a first key value if the voltage of one of the I/O ports K1~Kn is changed to low when all the I/O ports K1~Kn are set to input ports. The first key value consists of n numbers. In the embodiment, the numbers are 0 and 1. The number 0 indicates the voltage of one of the I/O ports is changed to low, and the number 1 indicates the voltage of one of the I/O ports is changed to high. For the first key value, the order of the n numbers are arranged according to an order of the n I/O ports K1~Kn. In the embodiment, for the first key value, the number corresponding to the I/O port K1 is in the first position from left to right. Accordingly, the number corresponding to the I/O port Kn is in the n position from left to right. In an alternative embodiment, the number corresponding to the I/O port Kn can be placed in the first position from left to right, and the number corresponding to the I/O port K1 can be placed in the n position from left to right.

The processing unit 100 records a second key value after all the I/O ports K1~Kn are reset to input ports. The second key value consists of n numbers. In the embodiment, the numbers are 0 and 1. The number 0 indicates the voltage of one of the I/O ports is low, and the number 1 indicates the voltage of one of the I/O ports is high. For the second key value, the order of the n numbers are arranged according to an order of the n I/O ports K1~Kn. In the embodiment, for the second key value, the number corresponding to the I/O port K1 is in the first position from left to right. Accordingly, the number corresponding to the I/O port Kn is in the n position from left to right. In an alternative embodiment, the number corresponding to the I/O port Kn can be in the first position from left to right, and the number corresponding to the I/O port K1 can be in the n position from left to right.

The processing unit 100 records a third key value according to the first key value and the second key value. The third key value consists of 2n numbers. In the embodiment, the first n numbers from left to right are the same as the first key value and the remaining numbers from left to right are the same as the second key value. In an alternative embodiment, the first n numbers from left to right can be the same as the second key value and the remaining numbers from left to right can be the same as the first key value.

In the embodiment, a key table is also pre-stored in the memory of the keyboard 10 which records relationships between third key values and the switches. In the key table, each switch corresponds to one third key value. The processing unit 100 consults the key table to determine which switch is pressed according to the determined third key value. For example, when n is equal to 4, the table appears as follows. For the first key value, the number corresponding to the I/O port K1 is in the first position from left to right. For the second key value, the number corresponding to the I/O port K1 is in the first position from left to right. For the third key value, first four numbers from left to right are the same as the first key value, and the last four numbers from left to right are the same as the second key value.

| Key table | | | |
|---|---|---|---|
| Switch | First key value | Second key value | Third key value |
| S1-1 | 0111 | 1000 | 01111000 |
| S1-2 | 0111 | 1100 | 01111100 |
| S1-3 | 0111 | 1010 | 01111010 |
| S1-4 | 0111 | 1001 | 01111001 |
| S2-1 | 1011 | 1100 | 10111100 |
| S2-2 | 1011 | 0100 | 10110100 |
| S2-3 | 1011 | 0110 | 10110110 |
| S2-4 | 1011 | 0101 | 10110101 |
| S3-1 | 1101 | 1010 | 11011010 |
| S3-2 | 1101 | 0110 | 11010110 |
| S3-3 | 1101 | 0010 | 11010010 |
| S3-4 | 1101 | 0011 | 11010011 |
| S4-1 | 1110 | 1001 | 11101001 |
| S4-2 | 1110 | 0101 | 11100101 |
| S4-3 | 1110 | 0011 | 11100011 |
| S4-4 | 1110 | 0001 | 11100001 |

Figure 4:
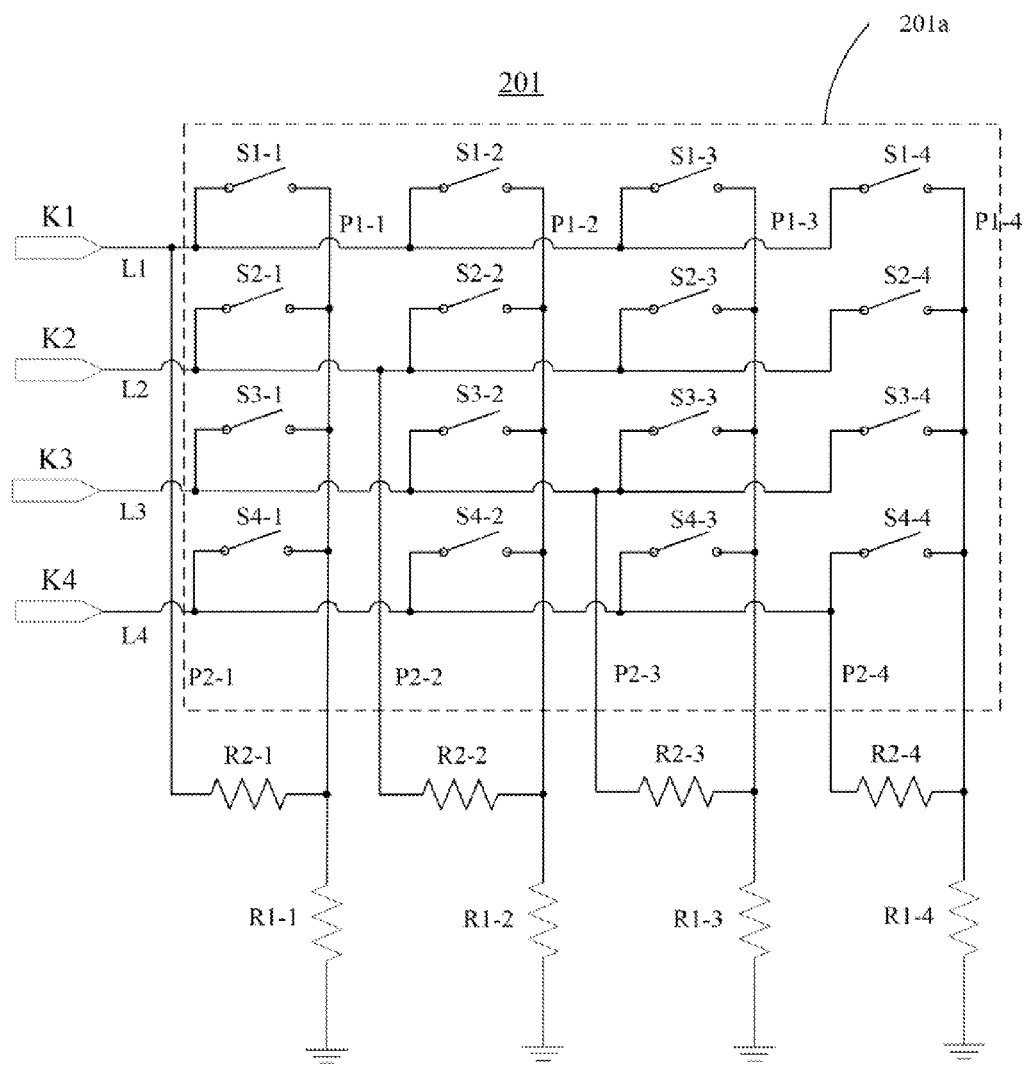
FIG. 4 is an example of the scanning circuit in FIG. 3 with four rows and four columns.

Referring to FIG. 4, compared with FIG. 3, four I/O ports K1, K2, K3, and K4 are provided in the scanning circuit 201 with sixteen switches S1-1~S4-4 in a switch matrix 201a.

Figure 5:
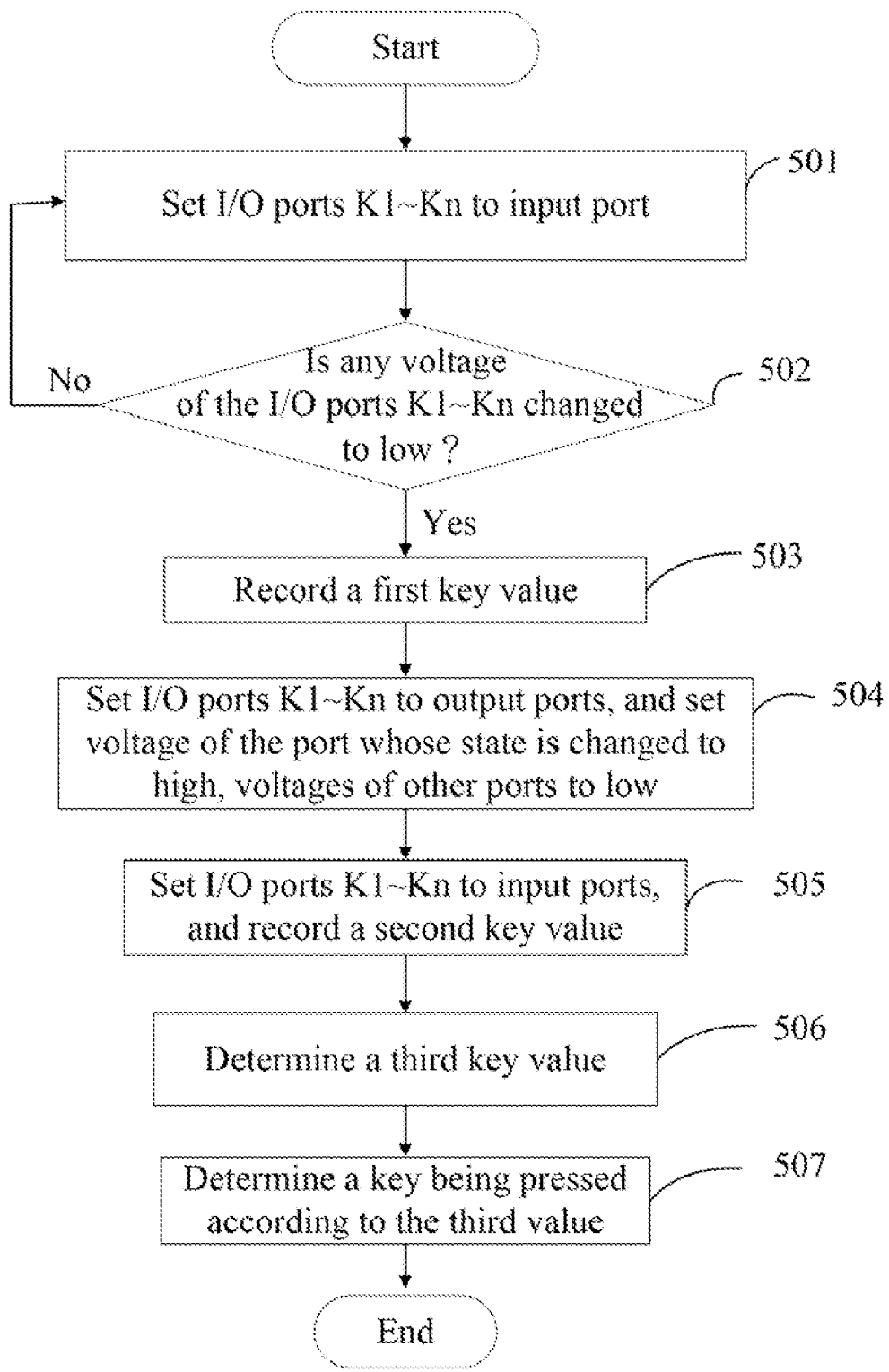
FIG. 5 is a flowchart of a scanning method implemented by the scanning circuit in FIG. 3 in accordance with an exemplary embodiment.

Referring to FIG. 5, the scanning application 300 is implemented by the processing unit 100 for scanning the keyboard 10 to determine which key is pressed, as follows.

In Step 501, the processing unit 100 sets the I/O ports K1~Kn to input ports. In Step 502, the processing unit 100 determines whether one of the I/O ports K1~Kn is changed to low. If so, Step 503 is implemented, and if not, Step 501 is repeated. In Step 503, the processing unit 100 records a first key value. In Step 504, the processing unit 100 sets all the I/O ports K1~Kn to output ports, and sets the voltage of the I/O port the state of which has been changed to low to high and the voltages of other I/O ports to low. In Step 505, the processing unit 100 resets all the I/O ports K1~Kn to input ports, checks the I/O ports K1~Kn, and records a second key value. In Step 506, the processing unit 100 determines a third key value according to the first key value and the second key value. In Step 507, the processing unit 100 consults the key table to determine which switch is pressed according to the third key value.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being or exemplary embodiments of the present disclosure.

What is claimed is:

1. A scanning circuit for a keyboard with a plurality of keys, the scanning circuit comprising:
   n rows L1~Ln, wherein n is a natural number not less than two; and
   2n columns P1-1~P1-n and P2-1~P2-n;
   wherein the n rows L1~Ln and the n columns P1-1~P1-n cooperatively form a switch matrix comprising n*n switches S1-1~Sn-n, all ends of the switches in the same row electrically connected to one of n I/O ports K1~Kn, respectively, the ends of the switches in the same column electrically connected to ground via one resistor R1-1~R1-n, respectively, each of resistors R2-1~R2-n is electronically connected in one column of the columns P2-1~P2-n, and connected between one of the I/O ports K1~Kn and ground via one of the resistors R1-1~R1-n, respectively.

2. The scanning circuit according to claim 1, wherein the resistances of the resistors R1-1~R1-n are similar to each other or the same.

3. The scanning circuit according to claim 2, wherein the resistances of the resistors R2-1~R2-n are similar to each other or the same, and exceed those of the resistors R1-1~R1-n.

4. A keyboard with a plurality of keys, the keyboard comprising:
   a scanning circuit further comprising n rows L1~Ln, wherein n is a natural number not less than two; 2n columns P1-1~P1-n and P2-1~P2-n, wherein the n rows L1~Ln and the n columns P1-1~P1-n cooperatively form a switch matrix comprising n*n switches S1-1~Sn-n, ends of the switches in the same row are electrically connected to one of n I/O ports K1~Kn, respectively, the ends of the switches in the same column are electrically connected to ground via one resistor R1-1~R1-n, respectively, and each of resistors R2-1~R2-n is electronically connected in one column of the columns P2-1~P2-n, and connected between one of the I/O ports K1~Kn and ground via one of the resistors R1-1~R1-n, respectively;
   a processing unit further comprising the n I/O ports K1~Kn, wherein the n I/O ports K1~Kn are configured to electrically connect the scanning circuit to the processing unit; and
   a scanning application implemented by the processing unit to determine which switch is pressed.

5. The keyboard according to claim 4, wherein when one of the I/O ports K1~Kn is used as an input port, voltage of the one I/O port K1~Kn is determined by an external input source connected with the one I/O port K1~Kn; and when one of the I/O ports K1~Kn is used as an external output port, the voltage of the one I/O ports K1~Kn is determined by the processing unit.

6. The keyboard according to claim 4, wherein the processing unit is a single-chip microprocessor further comprising a power pin electronically connected to a power supply VCC, and a ground pin electronically connected to ground.

7. A scanning method, comprising:
   setting all I/O ports K1~Kn to input ports;
   detecting states of the I/O ports K1~Kn;
   determining that one of switches in one row with ends electrically connected to one I/O port the voltage of which is changed to low is pressed;
   setting all the I/O ports K1~Kn to output ports after determining that one of the switches is pressed;
   setting the voltage of one of the I/O ports K1~Kn the voltage of which has been changed to low to high, and the voltages of the other I/O ports the voltage of which have been kept high to low;
   resetting all the I/O ports K1~Kn to input port;
   re-detecting the states of the I/O ports K1~Kn; and
   determining that the switch with one end in the row electrically connected to the one I/O port the voltage of which is set to high, and another end in the column electrically connected to the one I/O port via one of n resistors R2-1~R2-n the voltage of which is changed to high, or remains high if voltages of the I/O ports are not changed is pressed.

8. The scanning method according to claim 7, further comprising:
   recording a first key value if voltage of one of the I/O ports K1~Kn is changed to low after the I/O ports K1~Kn are set to input ports, wherein the first key value consists of n numbers of 0 or 1, the number 0 indicates the voltage of one of the I/O ports is changed to low, and the number 1 indicates the voltage of one of the I/O ports is changed to high, the order of the n numbers are arranged according to an order of the n I/O ports K1~Kn;
   recording a second key value after the I/O ports K1~Kn are all re-set to input ports, wherein the second key value consists of n numbers of 0 and 1, the number 0 indicates the voltage of one of the I/O ports is low, and the number 1 indicates the voltage of one of the I/O ports is high, the order of the n numbers are arranged according to an order of the n I/O ports K1~Kn;
   recording a third key value according to the first key value and the second key value, wherein the third key value consists of 2n numbers, with the first n numbers the same as the first key value and the last n numbers the same as the second key value; and
   consulting a key table recording relationship of third key values and switches, wherein in the key table, each third key value corresponds to one switch; and
   determining which switch is pressed according to the third key value in the key table.

9. The scanning method according to claim 8, wherein for the first key value, the number corresponding to the I/O port K1 is in the first position from left to right, the number corresponding to the I/O port Kn is in the n position from left to right.

10. The scanning method according to claim 8, wherein for the first key value, the number corresponding to the I/O port Kn is in the first position from left to right, and the number corresponding to the I/O port K1 is in the n position from left to right.

11. The scanning method according to claim 8, wherein for the second key value, the number corresponding to the I/O port K1 is in the first position from left to right, the number corresponding to the I/O port Kn is in the n position from left to right.

12. The scanning method according to claim 8, wherein for the second key value, the number corresponding to the I/O port Kn is in the first position from left to right, and the number corresponding to the I/O port K1 is in the n position from left to right.

13. The scanning method according to claim 8, wherein for the third key value, the first n numbers from left to right is the same as the first key value and the remaining numbers from left to right is the same as the second key value.

14. The scanning method according to claim 8, wherein for the third key value, the first n numbers from left to right is the same as the second key value and the remaining numbers from left to right are the same as the first key value.

* * * * *